United States Patent [19]

Stachura

[11] Patent Number: 5,199,161
[45] Date of Patent: Apr. 6, 1993

[54] CABLE TESTING APPARATUS

[75] Inventor: Joseph F. Stachura, Lebanon, Pa.

[73] Assignee: AMP Incorporated, Harrisburg, Pa.

[21] Appl. No.: 742,676

[22] Filed: Aug. 7, 1991

[51] Int. Cl.⁵ ............................................. B23P 21/00
[52] U.S. Cl. ........................................ 29/705; 29/749; 29/753
[58] Field of Search ................. 29/857, 861, 862, 863, 29/705, 748, 749, 761, 753

[56] References Cited

U.S. PATENT DOCUMENTS

| 4,110,880 | 9/1978 | Peppler et al. | 29/33 |
| 4,285,118 | 8/1981 | Peppler et al. | 29/593 |
| 4,654,580 | 3/1987 | Keller | 29/705 X |
| 4,870,752 | 10/1989 | Brown et al. | 29/866 |
| 4,903,403 | 2/1990 | Brown et al. | 29/861 |

FOREIGN PATENT DOCUMENTS 0164570 12/1985 European Pat. Off. .

5383 1/1990 Japan ........................................ 29/705

Primary Examiner—Timothy V. Eley
Attorney, Agent, or Firm—James M. Trygg; Robert J. Kapalka

[57] ABSTRACT

A cable making machine for making and electrically testing a cable assembly is disclosed. The machine includes a test circuit for effecting the electrical tests and a unique probe means for electrically connecting the test circuit to the contacts of the connectors being terminated to the cable. The probe means includes a plurality of relatively thin elongated metal probe members having a substantially rectangular cross section that slide in slots formed in an insulated block. Spring members bias the metal probe members toward the connector contacts. A cam, actuated by the ram of the machine causes the insulated block to move the metal robe members away from the connector contacts during the actual termination operation.

10 Claims, 6 Drawing Sheets

CABLE TESTING APPARATUS

This invention is related to apparatus for making cable assemblies and performing electrical testing thereof.

BACKGROUND OF THE INVENTION

The present invention relates to the testing of cable harness assemblies having planar, multi-conductor cable terminated to insulation displacement contacts, insulation piercing contacts, or the like housed in connectors. Such cable assemblies, their manufacture and testing are disclosed in U.S. Pat. Nos. 4,110,880 and 4,285,118 which issued to Peppler, et al., on Sep. 5, 1978 and Aug. 25, 1981 respectively and U.S. Pat. Nos. 4,870,752 and 4,903,403 which issued to Brown, et al., on Oct. 3, 1989 and Feb. 27, 1990 respectively, these patents being incorporated by reference as though set forth verbatim herein. The two Peppler, et al. patents disclose a cable harness making machine that performs an electrical test of the conductive paths for shorts and opens. A manually operable switch is provided for indicating the number of conductors in the cable. The two Brown, et al. patents disclose a cable harness making machine that performs electrical testing for shorts and opens at various stages of manufacture of the harness so that a connector will not be inadvertently terminated to a partially completed harness assembly that is defective. In all of these cases the electrical probes that connect the contacts of the connectors to the testing circuit are elongated conductors spring biased into contact with the individual connector contacts. The elongated conductors are of cylindrical shape and telescope into a tube containing a compression spring. Such probes are somewhat bulky and are therefore limited to applications where the individual connector contacts have substantial space surrounding them. Additionally, such probes engage the connector contacts by means of an abutting action rather than a wiping action, the latter being preferably because the contacting surfaces are wiped clean. In the event that the probes engage a surface of a connector contact that is angled with respect to the direction of movement of the probe, the probe has a tendency to bind in its tube making it difficult or impossible to insert the connector into the machine.

What is needed is an electrical test probe that can be spaced close enough to engage the closely spaced contacts of miniature connectors such as the modular plug. The probe should be able to move into and out of electrical engagement with the connector contact without binding and should provide a wiping action to assure good electrical contact.

SUMMARY OF THE INVENTION

The present invention includes a probe means for electrically connecting contacts of connections terminated to a cable to a test circuit for testing continuity of the terminations. The probe means is included in a cable making machine for making and testing the cable assembly. The machine includes a base having a pair of spaced openings for receiving and guiding the connectors, a reciprocating ram arranged to move toward and away from the base, mating terminating tooling carried by the ram, and an electrical test module for testing continuity.

The electrical probe means includes a plurality of probe members, each having an elongated body, a contacting surface at one end of the body, and a shank at the other end thereof. A guide is provided having means for spacing and guiding the probe members so that the contacting surface of each probe member is movable between a position of engagement with a respective one of the connector contacts and a position spaced therefrom. Additionally, means is provided for moving the contacting surfaces of the probe members out of their position of engagement to their spaced position during termination of the connectors to the cable.

DESCRIPTION OF THE PREFERRED EMBODIMENT

Figure 1:
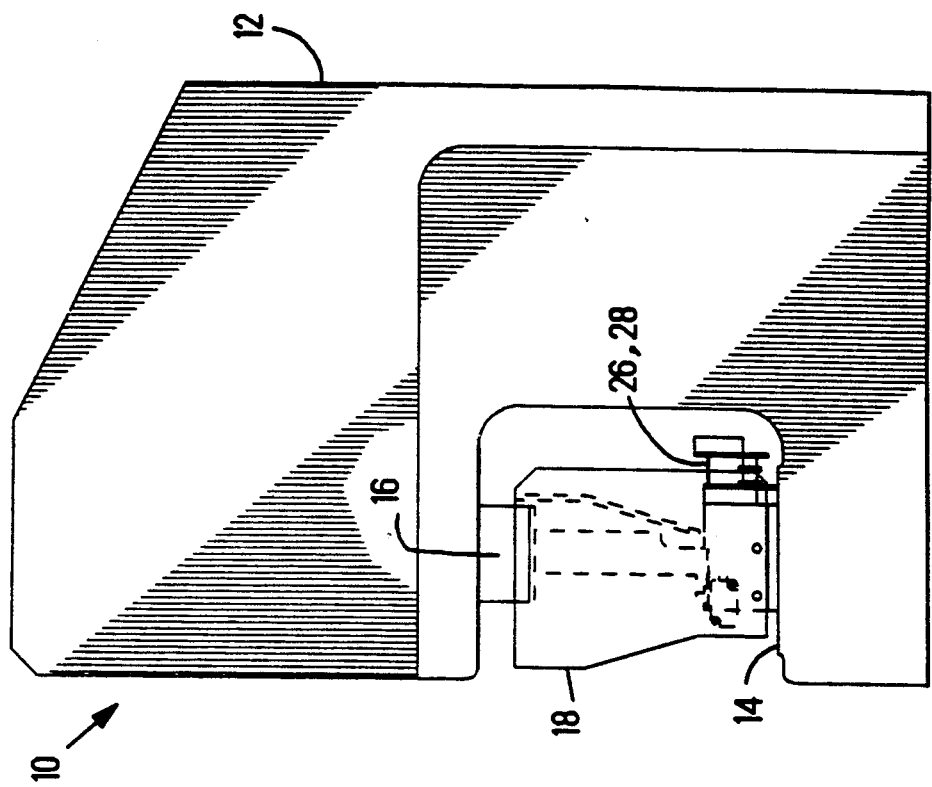
FIG. 1 is a side view of a cable making machine showing a press and terminating module in accordance with the of the present invention.
Figure 2:
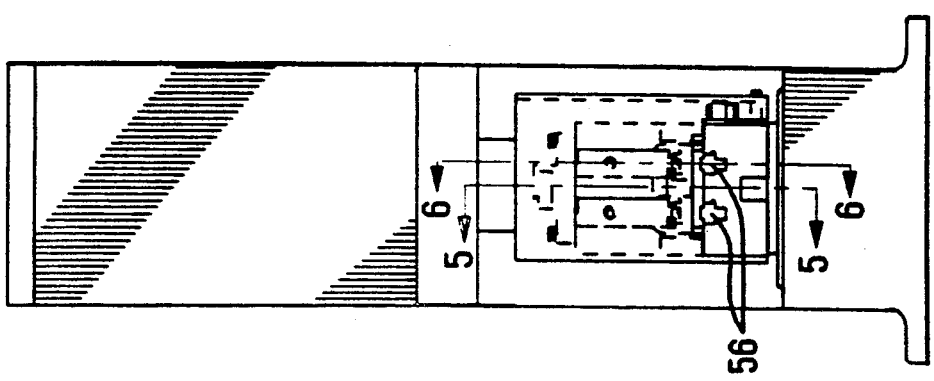
FIG. 2 is a front view of the machine of FIG. 1.
Figure 3:
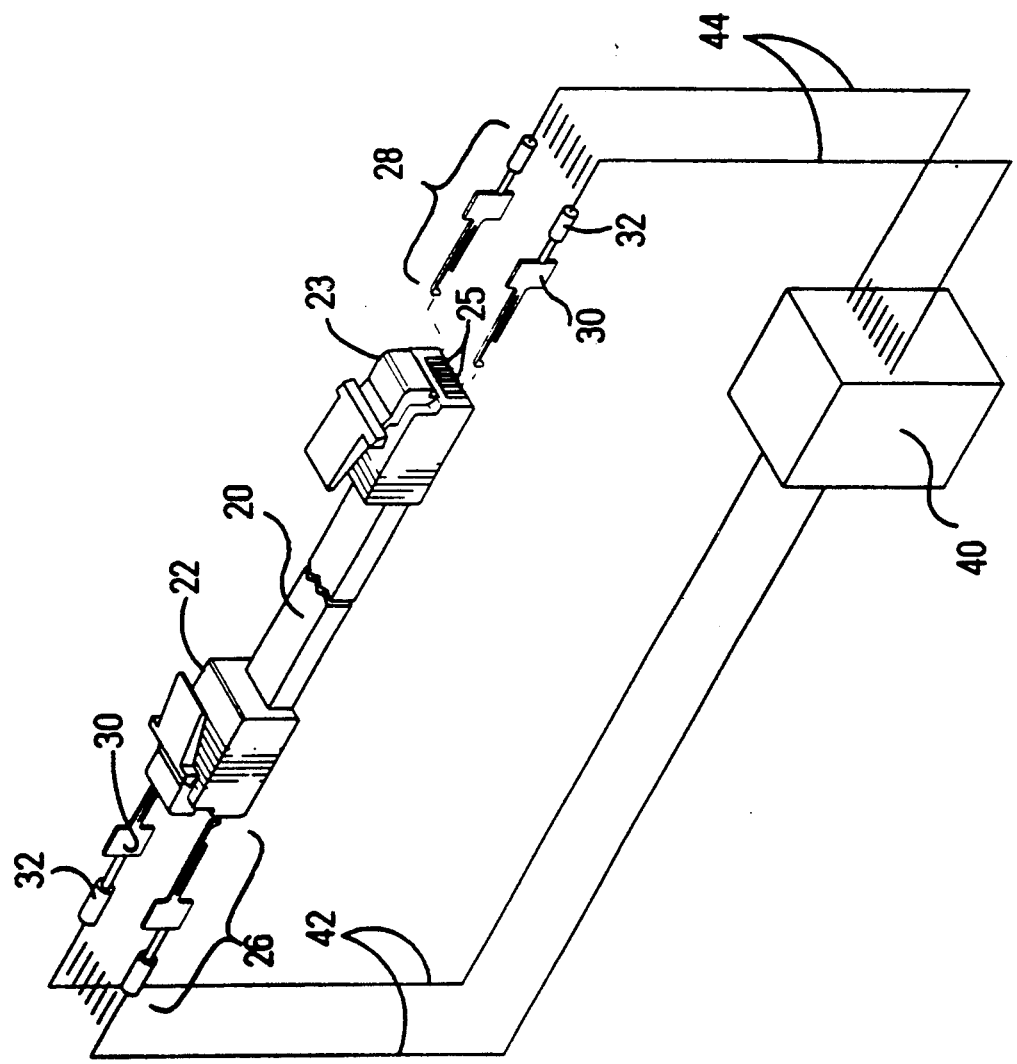
FIG. 3 is a schematic showing the relationship of a typical cable assembly to the testing apparatus of the present invention.

There is shown in FIGS. 1 and 2 a cable making machine 10 including a press or power unit 12 having a mounting plate 14 and a ram 16, moveable toward and away from the mounting plate 14. A connector terminating module 18 is secured to the mounting plate 14 and coupled to the ram 16 in the usual manner so that when the press or power unit 12 is actuated, the ram 16 causes the module 18 to terminate a pair of connectors, one to each end of a length of cable. The cable assembly is shown in FIG. 3 where a length of cable 20 has a connector 22,23, in the present example a modular plug, attached to each end. An array of probes 26 is arranged to engage and make electrical contact with the contacts 25 of the modular plug 22 and a second array of probes 28 is arranged to engage and make electrical contact with the contacts 25 of the other modular plug 23. Each individual probe of the two arrays 26 and 28 is composed of a probe member 30 spring biased toward the modular plugs 22 and 23 by a spring member 32 so that the probes engage and are maintained in good electrical contact with the individual contacts 25 of the plugs. As shown in FIG. 3, the two arrays of probes 26 and 28 are interconnected to a test module 40 by means of the circuits 42 and 44 respectively.

Figure 4:
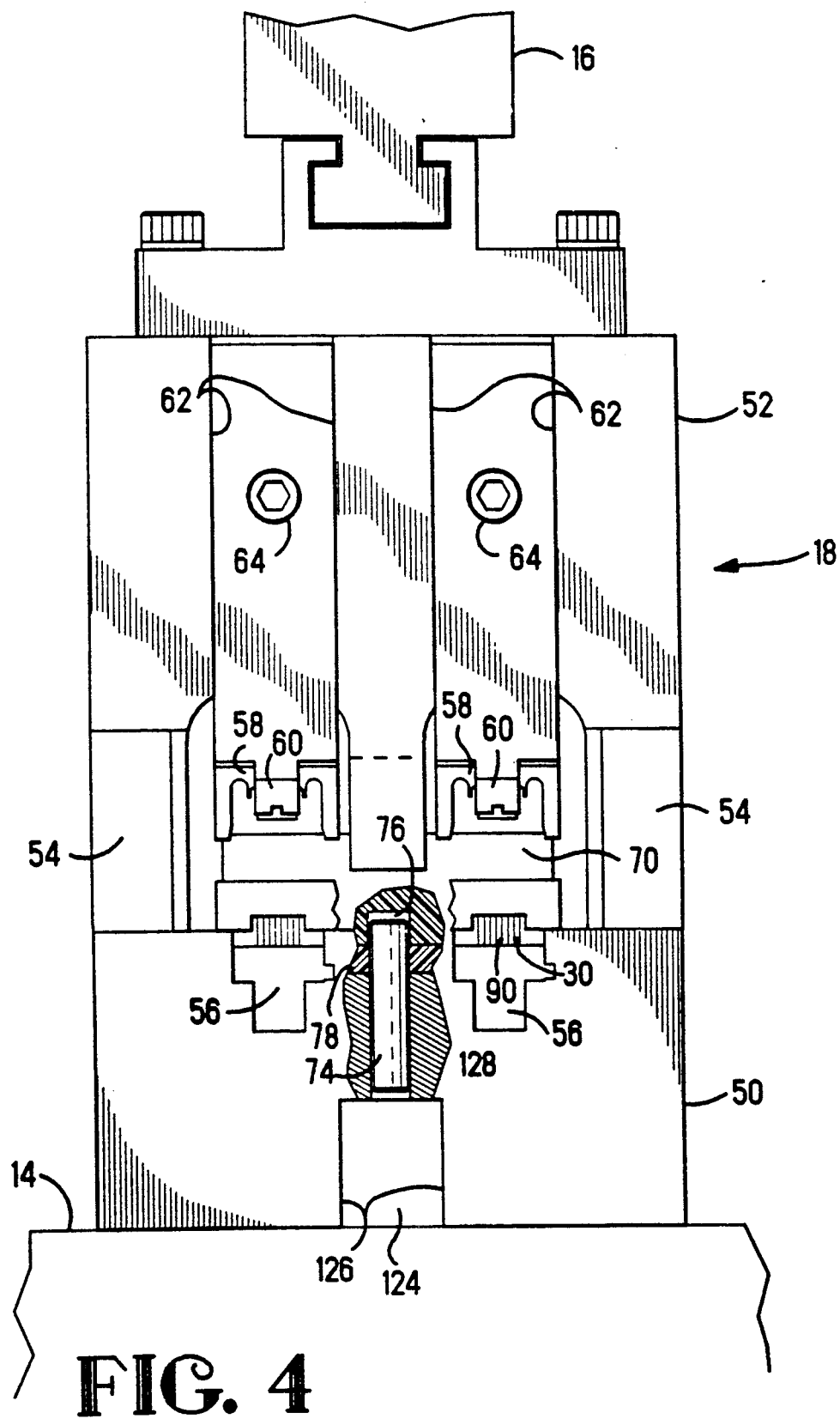
FIG. 4 is an enlarged view of a portion of the machine shown in FIG. 2.

There is shown in FIG. 4 a front view of the connector terminating module 18 having a base 50 attached to the mounting plate 14 and a reciprocating member 52, coupled to and carried by the ram 16. The reciprocating member 52 includes a pair of guide legs 54 which are accommodated in appropriately sized openings in the base 50 to very precisely align the member 52 with the base 50. A pair of openings 56 are formed in the base 50 for receiving the connectors 22 and 23 for termination to the cable 20. A pair of contact engaging stuffing bars 58 and cable strain relief bars 60 are arranged within grooves 62 formed in the front surface of the reciprocating member 52 and secured in place by the screw fasteners 64. The grooves 62 are positioned so that the stuffing bars 58 and strain relief bars 60 are in precise vertical alignment with the openings 56. Thus, with the connectors 22 and 23 fully inserted into the openings 56, the stuffing bars 58 will accurately engage the contacts 25 and properly set them into their respective connector housing as the ram 16 causes the reciprocating member 52 to move fully toward the base 50.

Figure 5:
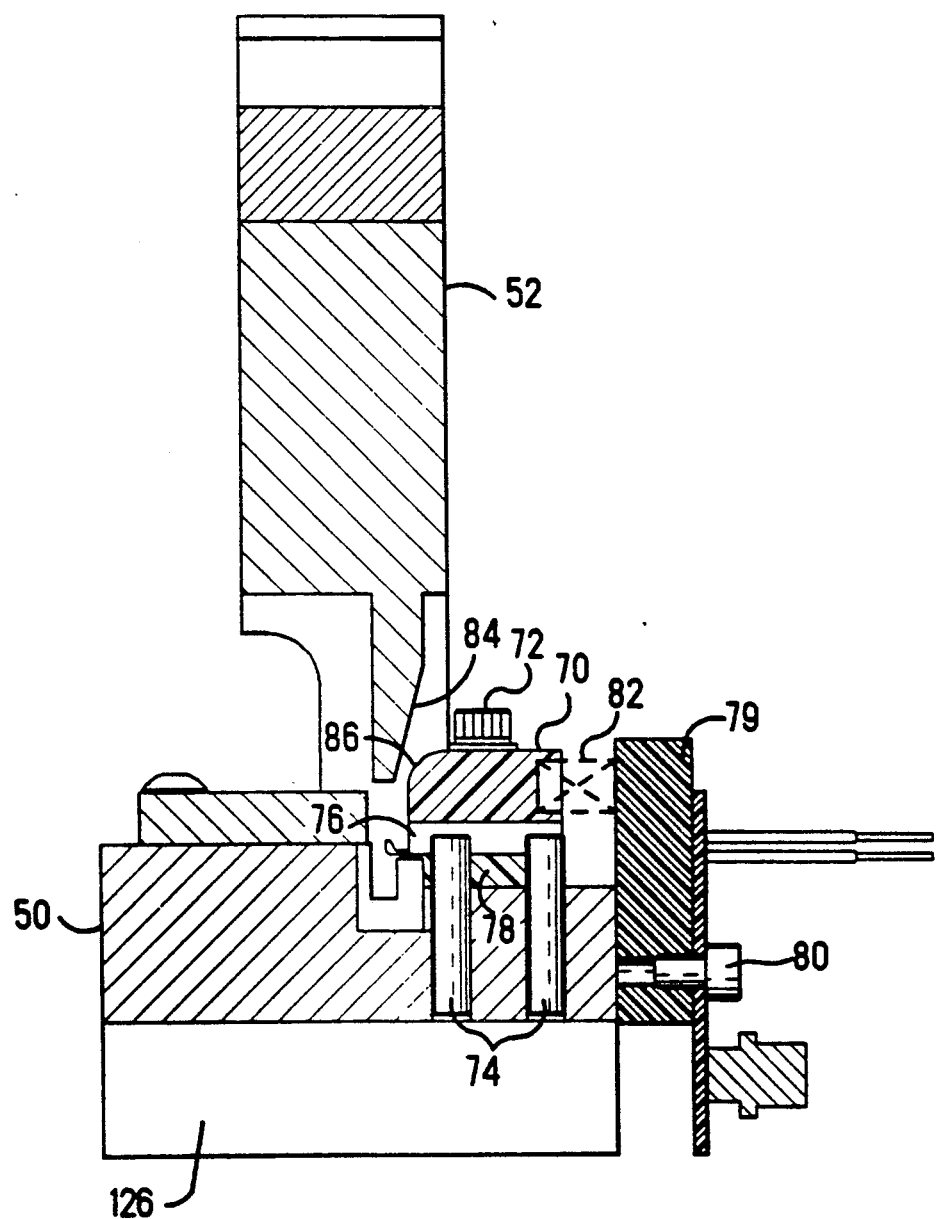
FIG. 5 is a cross-sectional view taken along the lines 5—5 of FIG. 2.

As shown in FIGS. 4 and 5, an insulating guide block 70 is movably coupled to the base 50 by means of the two screw fasteners 72 and the two pins 74 which are pressed into the base 50. The screw fasteners 72 pass through two elongated holes in the block 70 and into threaded holes in the base 50. A slot 76 is disposed in the guide block 70 within which the two pins 74 extend so that the guide block 70 may slide a small amount left and right as view in FIG. 5, being guided by the pins 74 in the slot 76. The two screw fasteners 72 are arranged to limit vertical movement of the block 70 while permitting the side to side movement. An insulating spacer plate 78 is secured to the base 50 between the base 50 and the guide block 70 for a purpose that will be addressed below. A second insulating plate 79 is secured to the base 50 by means of the screw fasteners 80. A resilient member 82, such as a compression spring, is arranged between the plate 79 and the guide block 70 so that the guide block 70 is urged to its left most position, as viewed in FIG. 5. The reciprocating member 52 includes a cam surface 84 which will, upon downward movement of the member 52, engage the surface 86 of the guide block 70 causing it to slide to the right, as view in FIG. 5, against the urging of the resilient member 82.

The guide block 70 has two groups of spaced probe slots 90 disposed in the side facing the spacer plate 78, one group being opposite each of the openings 56. The slots 90 are each arranged to slidingly receive a probe member 30, which in the present example has a substantially rectangular cross section. In this example the top surface of the insulating plate 78 serves to enclose the bottom of the slot 90 so that the probe member 30 can slide along this surface. The individual slots 90 are arranged so that each is in alignment with and adjacent to a contact 25 of the connectors 22 and 23, there being one slot 90 for each contact 25. In the present example there are 10 such contacts and associated slots for each of the two groups of probes.

Figure 6:
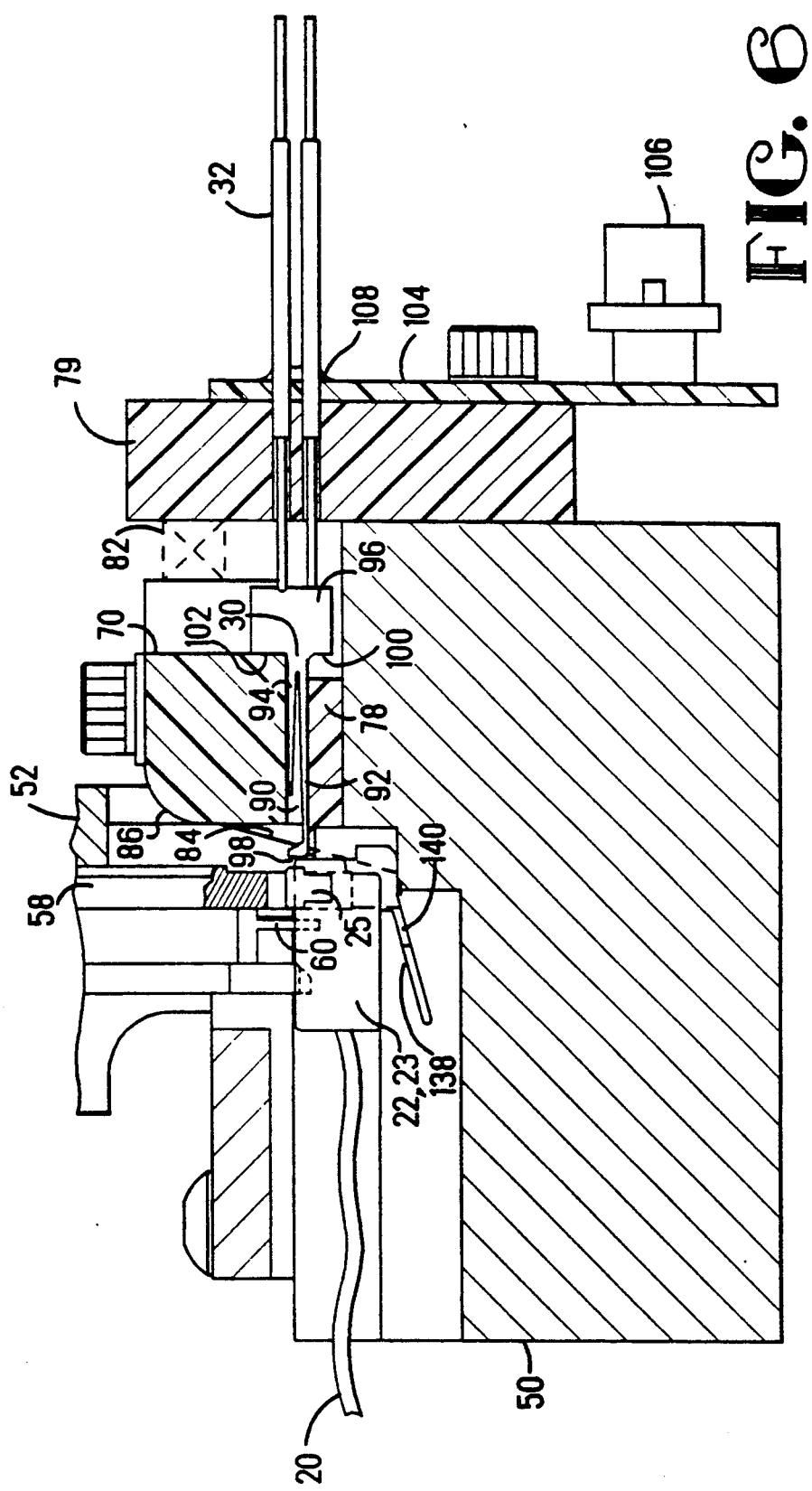
FIGS. 6 and 7 are cross-sectional views taken along the lines 6—6 of FIG. 2 showing the probe member of the present invention engaged and disengaged respectively.
Figure 7:
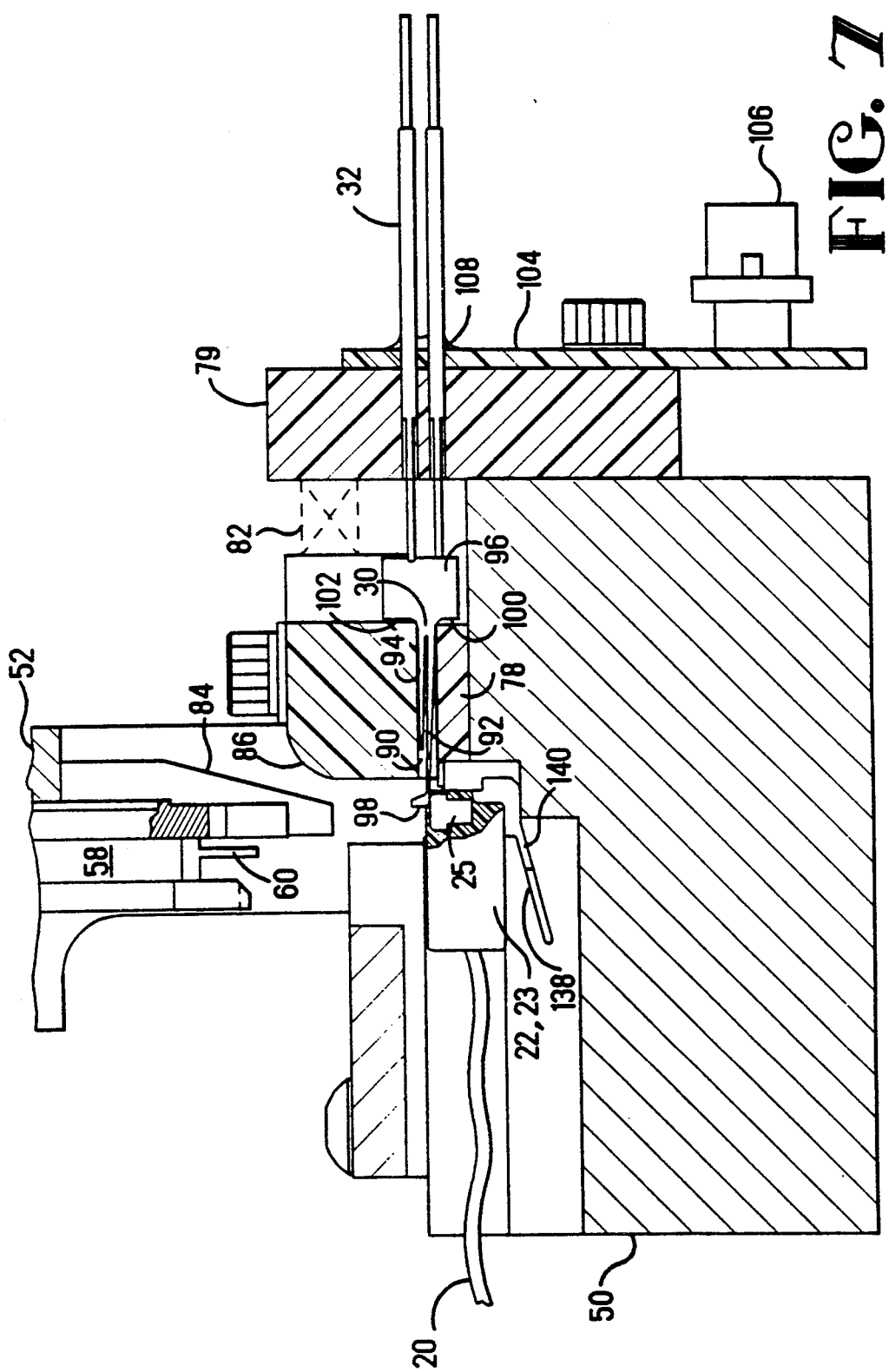

The probe members 30 include an elongated body portion that is substantially rectangular in cross section, as stated above, and consists of a lower cantilevered beam 92 and an upper cantilevered beam 94, both of which extend from a somewhat enlarged shank 96. A contacting surface 98 is disposed on the upturned end of the lower beam 72 for making electrical contact with a respective connector contact 25. The shank 96 includes a lower stop surface 100 which abuts the edge of insulating plate 78 to limit movement of the probe members 30 toward the connectors 22,23, and an upper stop surface 102 which abuts the right edge, as viewed in FIG. 6, of the guide block 70 when the guide block is moved to the right as shown. Such movement of the guide block 70 will necessarily move all of the probe members 30 to the right. There is an individual spring member 32 in electrical engagement with the shank 96 of each probe member 30, urging the member 30 toward the left, as viewed in FIGS. 6 and 7. The spring members 32 consist of an outer metal tube and an inner metal rod which freely slides within the tube. A coil spring within the tube biases the rod to the left as viewed in FIGS. 6 and 7. A printed circuit board 104 is attached to the second insulating plate 79 as shown in FIGS. 5, 6, and 7, and includes an electrical connector 106 mounted thereto. The outer surfaces of the tubes are soldered, as at 108 in FIG. 6, to metalized circuits which are on the circuit board 104 and interconnect to the pins of the connector 106. Thus, the circuits 42 and 44, as shown in FIG. 3, can be plugged into the connector 106 to electrically connect the probe members 30 to the test module 40. While the spring members 32 themselves may be used as probe members, see the probe and its mounting as disclosed in the above referenced U.S. Pat. No. 4,285,118, the center to center spacing of these devices is substantially larger than the center to center spacing of the contacts 25 of the connectors 22 and 23. However, by using the relatively thin probe members 30 spaced in correspondence with the contacts 25, the larger spring members 32 can be arranged in two or more rows and staggered so that adjacent probe members 30 are engaged by spring members 32 in different rows. A slight V-notch is formed in the ends of each of the rods of the spring members 32 where they engage the shanks 96 of the probe members 30 to help maintain their alignment. While the spring members 32 having this particular rod and tube construction are shown, other spring member structures may advantageously be utilized in the practice of the present invention.

In operation, the ends of a length of cable 20 are prepared and inserted into the connectors 22 and 23, which are then inserted into the two openings 56. Note that at this point, the contacts 25 of each of the connectors are in their raised positions, as shown in FIG. 6, although the reciprocating member 52 and stuffing bar 58 would be in their retracted, full up, positions. As insertion of the connectors into the openings 56 continues, the tabs 140 engage the camming surfaces 138 and the right most edge of the contacts 25 engage the contacting surfaces 98 of the probe members 30. As insertion continues the probe members 30 are caused to slide to the right, as viewed in FIG. 6, thereby causing the rods to telescope into the tubes of the spring members 32 against the biasing force of the springs contained therein. When the connectors 22 and 23 are fully seated and ready for termination the press 12 is then actuated to cause the ram 16 and reciprocating member 52 to move downwardly toward the base 50. As this occurs, and prior to the stuffing bar 58 engaging the contacts 25, the cam surface 84 engages the surface 86 of the insulating guide block 70 causing the guide block to slide to the right and against the stop surfaces 102 of the probe members 30, in turn causing the probe members 30 to slide to the right within their openings 90 so that the contact surfaces 98 disengage and move away from the contacts 25 as shown in FIG. 6. At this point the stuffing bar 58 engages the top of the contacts 25 pushing them downwardly into the connector bodies and into engaging contact with the individual conductors of the cable 20. As the press 12 continues its cycle, the ram 16 and reciprocating member 52 move upwardly away from the base 50 allowing the guide block 70 to move to the left under the urging of the spring 82 thereby allowing the probe members 30 to also move to the left under the urging of the spring members 32. As the guide member 70 moves to its full left most position, as shown in FIG. 7, the contacting surfaces 98 engage the radiused top right corner of the contacts 25, and ride up and over by deflecting the cantilevered lower beam 92 a small amount. In this way, the contacting surfaces 98 wipe the surfaces of the contacts 25 clean and in addition have a known contact force corresponding to the design of the lower beam 92 independent of small variations in the dimensional tolerances of the parts. As stated above, the body portion of the probe member 30 is substantially rectangular in cross section and consists of the lower and upper cantilevered beams 92 and 94 which accommodate these small dimensional variations without binding of the probe members 30 within their openings 90. It was found that probe members having solid body portions would frequently bind.

At this point the test module 40 automatically tests the terminations and indicates whether or not the finished cable assembly has passed the test. The cable assembly is then removed and the cycle repeated.

Some important advantages of the present invention are that connectors, such as the modular plugs, having very closely spaced contacts can be accommodated by the probe members, and that small dimensional variations will not cause the probe members to bind. Additionally, excellent electrical contact between the probe member and the connector contact is assured by the wiping action as the probe member engages the contact and due to the beam structure of the probe member applying a desired contact force.

I claim:

1. In a cable making machine for making and electrically testing a cable assembly including a cable having conductors terminated to contacts of a first connector at one end and contacts of a second connector at an other end, said machine including a base having a pair of spaced openings for receiving and guiding said first and second connectors, a reciprocating ram arranged to move toward and away from said base, terminating tooling carried by said ram, and an electrical test module for testing continuity between the contacts of said first connector through the conductors of said cable to the contacts of said second connector, electrical probe means for electrically connecting said contacts of said first and second connectors with said test module comprising:
(a) a plurality of probe members each having an elongated portion, a contacting surface at one end of said elongated portion, and a shank at the other end thereof;
(b) a guide having means for spacing and guiding said plurality of probe members so that the contacting surface of each probe member is movable between a position of engagement with a respective one of the contacts of said first and second connectors and a position spaced therefrom; and
(c) means for moving said contacting surfaces of the probe members out of said position of engagement to said position spaced therefrom during termination of said first and second connectors to said cable,
wherein said elongated portion of each probe member includes resilient means for preventing binding of said probe member with said guide during said moving of said contacting surface.

2. The electrical probe means according to claim 1 wherein said elongated portion of each of said plurality of probe members comprises a pair of cantilevered arms extending from said shank, said arms being said resilient means and said contacting surface being on one of said pair of arms.

3. The electrical probe means according to claim 2 wherein said guide includes a block having a plurality of openings for receiving said elongated portion of said plurality of probe members, said arms arranged to slide within said openings so that said contacting surface moves between said position of engagement with said connector contacts and said position spaced therefrom.

4. The electrical probe means according to claim 3 wherein said lower cantilevered arms are resilient so that upon engagement with said connection contacts, said arms will deflect while sliding within said openings.

5. The electrical probe means according to claim 4 wherein each said opening is a groove of substantially rectangular cross section.

6. The electrical probe means according to claim 3 wherein said means for moving said contacting surfaces out of said position of engagement includes:
(a) means for coupling said guide to said base so that said guide is movable away from said connector contacts;
(b) an abutting surface on said guide for engaging said shank of each probe member;
(c) cam means associated with said ram so that when said ram moves toward said base to effect termination of said connectors to said cable, said cam means causes said guide to move so that said abutting surface engages the shanks of said probe members thereby moving said contact surfaces to said position spaced from said connector contacts.

7. The electrical probe means according to claim 6 wherein said cam means engages said block thereby effecting said movement of said guide for moving said contacting surface to said position spaced from said contacts.

8. The electrical probe means according to claim 1 wherein said guide electrically insulate said plurality of probe members from one another.

9. The electrical probe means according to claim 1 including resilient means for urging said contacting surface of the probe members into said position of engagement.

10. In a machine for terminating the conductors of a cable to contacts within a connector housing, said machine having means for testing electrical continuity of the terminations, probe means for electrically connecting said contacts to said means for testing comprising:
(a) a plurality of probe members for electrically engaging said contacts;
(b) a guide block having a plurality of openings for receiving and guiding movement of said probe members, one such opening for each probe member;
(c) means for moving said probe members in a first direction into electrical engagement with their respective contacts and for moving said probe members in a second direction out of said electrical engagement,
wherein each said probe member has an elongated portion comprising a pair of cantilevered arms extending from a shank, and a contacting surface on an end of one of the arms.

* * * * *